US012749473B2

(12) United States Patent
Han et al.

(10) Patent No.: US 12,749,473 B2
(45) Date of Patent: Sep. 29, 2026

(54) HEADSET DEVICE WITH SPEAKERS, SIGNAL PROCESSING METHOD AND ANALYSIS SYSTEM THEREOF

(71) Applicant: Luxshare Precision Technology(Nanjing)Co., LTD, Nanjing City (CN)

(72) Inventors: FeiFei Han, Nanjing City (CN); GuoJun Xu, Nanjing City (CN); Gang Xu, Nanjing City (CN)

(73) Assignee: LUXSHARE PRECISION TECHNOLOGY (NANJING) CO., LTD, Nanjing City (CN)

( * ) Notice: Subject to any disclaimer, the term of this patent is extended or adjusted under 35 U.S.C. 154(b) by 370 days.

(21) Appl. No.: 18/133,292

(22) Filed: Apr. 11, 2023

(65) Prior Publication Data

US 2024/0112664 A1 Apr. 4, 2024

(30) Foreign Application Priority Data

Sep. 27, 2022 (CN) ........................ 202211180845.4

(51) Int. Cl.
*G10K 11/178* (2006.01)
*H04R 1/10* (2006.01)
*H03F 3/21* (2006.01)

(52) U.S. Cl.
CPC .. *G10K 11/17823* (2018.01); *G10K 11/17827* (2018.01); *G10K 11/17873* (2018.01);
(Continued)

(58) Field of Classification Search
CPC ....... G10K 11/17823; G10K 11/17873; G10K 11/17827; H04R 1/041; H04R 1/075; H04R 1/1083
See application file for complete search history.

(56) References Cited

U.S. PATENT DOCUMENTS 10,714,072 B1 * 7/2020 Bodon ............. G10K 11/17854
10,834,494 B1 * 11/2020 Tong et al.
(Continued)

FOREIGN PATENT DOCUMENTS

CN 1771763 A 5/2006
CN 101751918 A 6/2010
(Continued)

OTHER PUBLICATIONS

Chinese Office Action and Search Report for Chinese Application No. 202211180845.4, dated Oct. 18, 2025, with English translation.
(Continued)

*Primary Examiner* — Fan S Tsang
(74) *Attorney, Agent, or Firm* — Birch, Stewart, Kolasch & Birch, LLP

(57) ABSTRACT

The embodiments of the present disclosure provide a headset device with speakers, a signal processing method and an analysis system thereof. The headset device with speakers includes a speaker assembly and a first sound receiving assembly, and provides noise reduction effect on surrounding environment by the signal processing method for the headset with speakers. The speaker assembly includes a signal processing module. The signal processing module performs calibration by the sound transfer function to solve the playback influence arisen from the sound transmission distance between the speaker assembly and the human ear. The signal processing module performs calibration to calibrate the signal outputted by the speaker assembly to cancel the environmental noise, so that it can effectively solve the problem of attenuation of the sound received by the human ear due to the sound transmission distance of the open speaker.

30 Claims, 7 Drawing Sheets

(52) U.S. Cl.
CPC ......... *H04R 1/1041* (2013.01); *H04R 1/1075* (2013.01); *H04R 1/1083* (2013.01); *G10K 2210/1081* (2013.01); *G10K 2210/3027* (2013.01); *G10K 2210/3044* (2013.01); *G10K 2210/3046* (2013.01); *G10K 2210/3055* (2013.01); *G10K 2210/3056* (2013.01); *G10K 2210/504* (2013.01); *H03F 3/21* (2013.01); *H03F 2200/03* (2013.01); *H04R 2460/01* (2013.01)

(56) References Cited

U.S. PATENT DOCUMENTS

| | | | | |
|---|---|---|---|---|
| 11,234,095 | B1 | 1/2022 | Cho et al. | |
| 12,057,099 | B1 * | 8/2024 | Shields | G10K 11/17879 |
| 2015/0296297 | A1 * | 10/2015 | Hua | G10K 11/17885<br>381/71.6 |
| 2015/0332662 | A1 * | 11/2015 | Hoang Co Thuy | H04R 5/033<br>381/71.6 |
| 2016/0300563 | A1 * | 10/2016 | Park | G10K 11/17817 |
| 2017/0053639 | A1 * | 2/2017 | Lu | G10K 11/17854 |
| 2017/0148428 | A1 * | 5/2017 | Thuy | H04R 1/1083 |
| 2019/0037324 | A1 * | 1/2019 | Darlington et al. | |
| 2019/0103090 | A1 * | 4/2019 | Cho | G10K 11/178 |
| 2019/0215598 | A1 | 7/2019 | Asada et al. | |
| 2020/0135163 | A1 * | 4/2020 | Lovitt et al. | |
| 2020/0296500 | A1 * | 9/2020 | Wang | G10K 11/17837 |
| 2020/0396552 | A1 | 12/2020 | Dickinson et al. | |
| 2022/0124431 | A1 * | 4/2022 | Hoang Co Thuy | H04R 1/1008 |
| 2022/0392427 | A1 * | 12/2022 | McCutcheon | H04R 1/1083 |
| 2023/0141100 | A1 * | 5/2023 | Farver | H04R 1/1083<br>381/71.6 |
| 2023/0336912 | A1 * | 10/2023 | Benattar | H04R 5/0335 |
| 2024/0257796 | A1 * | 8/2024 | Yu et al. | |

FOREIGN PATENT DOCUMENTS

| | | | |
|---|---|---|---|
| CN | 101184346 | B | 7/2011 |
| CN | 105100990 | A | 11/2015 |
| CN | 106792305 | A | 5/2017 |
| CN | 197852563 | A | 3/2018 |
| CN | 108206023 | A | 6/2018 |
| CN | 108769857 | A | 11/2018 |
| CN | 109104669 | A | 12/2018 |
| CN | 111565343 | A | 8/2020 |
| CN | 111696513 | A | 9/2020 |
| CN | 114143646 | A | 3/2022 |
| TW | 201508376 | A | 3/2015 |

OTHER PUBLICATIONS

Chinese Office Action and Search Report for Chinese Application No. 202211180845.4, dated Jun. 4, 2025, with English translation.

* cited by examiner

HEADSET DEVICE WITH SPEAKERS, SIGNAL PROCESSING METHOD AND ANALYSIS SYSTEM THEREOF

CROSS-REFERENCE TO RELATED APPLICATION

This application claims the priority benefit of Chinese Patent Application Serial Number 202211180845.4, filed on Sep. 27, 2022, the full disclosure of which is incorporated herein by reference.

BACKGROUND

Technical Field

The present disclosure relates to the technical field of speakers, particularly to a headset device with speakers, a signal processing method and an analysis system thereof.

Related Art

At present, the current in-ear or earmuff headphones generally have an active noise reduction function. This feature is automatically enabled when the device is worn. The external feedback radio element and the inner ear radio element retrieves the external environmental noise and the noise in the ear, and use the speaker to send out the anti-phase sound signal to eliminate the noise signal that the human ear can hear. These devices form an approximately closed space between the speaker and the human ear, in which the sound field approximates a pressure sound field. However, for open speakers (that is, earphones other than in-ear or earmuffs that are worn directly on the human ear), the sound field between the speaker and the human ear is not closed, so the sound input to the human ear from the speaker would change due to the distance between the speaker and the human ear. In addition, it is impossible to physically isolate external noise like in-ear or earmuff headphones, so the noise affection between the human ear and the speaker is larger. Therefore, the noise reduction function of the existing open speakers is affected by the external environment.

SUMMARY

The embodiments of the present disclosure provide a headset device with speakers, a signal processing method and an analysis system thereof to solve the problem that the noise reduction function of the existing open speakers is affected by the external environment.

In one aspect of the disclosure, the headset device with speakers comprises a headset assembly, a first sound receiving assembly and a speaker assembly. The first sound receiving assembly is configured on the headset assembly, the first sound-receiving assembly being at a position adjacent to a human ear. The speaker assembly is configured on the headset assembly, and the speaker assembly being on one side of the first sound-receiving assembly. The first sound receiving assembly receives ambient sound near the human ear, and provides the ambient sound to the speaker assembly for signal processing; the speaker assembly outputs the ambient sound after signal-processed to the human ear.

In one embodiment, the speaker assembly further comprises a signal processing module and an output module; the first sound receiving assembly is connected to the signal processing module, and the signal processing module is connected to the output module, wherein the first sound receiving assembly receives and converts the ambient sound into a capture signal, the signal processing module processes the capture signal, and the output module outputs and plays the processed capture signal.

In one embodiment, the signal processing module comprises an elimination unit, a calibration unit, and an inversion unit; the elimination unit performs signal elimination processing to the capture signal; the calibration unit performs calibration to the captured signal after signal elimination processed; the inversion unit performs inversion to the captured signal after calibrated; the output module outputs the captured signal after inverted to the human ear.

In one embodiment, the headset device further comprises an audio module and an elimination module; one end of the audio module is connected to the output module; one end of the elimination module is connected to the audio module; the other end of the elimination module is connected between the first sound-receiving assembly and the signal processing module; the audio module transmits the audio signal to the output module; the output module outputs the audio sound toward the human ear; the first sound receiving assembly receives the ambient sound into the capture signal; after the elimination module eliminates the audio signal in the capture signal, the captured signal with the audio signal eliminated is transmitted to the signal processing module.

In one embodiment, the signal processing module comprises an elimination unit, a calibration unit, and an inversion unit; the elimination unit performs signal elimination processing to the captured signal with the audio signal eliminated; the calibration unit performs calibration to the captured signal after signal elimination processed; the inversion unit performs inversion to the captured signal after calibrated; the output module outputs the captured signal after inverted and the audio signal outputted by the audio module to the human ear.

In one embodiment, the signal processing module further includes a gain adjustment unit; the gain adjustment unit is used to adjust the gain coefficient of the captured signal after inverted to adjust the noise reduction.

In one embodiment, the speaker assembly further comprises a control module; the control module controls the elimination unit, the calibration unit and/or the gain adjustment unit in the signal processing module.

In one embodiment, the ambient sound comprises a first ambient sound or a combination of the first ambient sound and an audio sound.

In one embodiment, the headset device further comprises a second sound receiving assembly; the second sound receiving assembly is configure on the headset assembly; the second sound receiving assembly is configured on the side of the first sound receiving assembly away from the human ear; the second sound receiving assembly is used to collect a second ambient sound away from the human ear.

In another aspect of the disclosure, a signal processing method, adapted to a headset device with speakers, comprising: receiving a first ambient sound adjacent to a human ear by a first sound receiving assembly, and converting the first ambient sound into a first captured signal by the first sound receiving assembly; transmitting the first captured signal to a signal processing module in a speaker assembly; sequentially performing transfer function calibration signal processing and inversion signal processing on the first captured signal by the signal processing module; and providing the first captured signal after processed to an output module of the speaker assembly for outputting toward the human ear.

In one embodiment, before the step of transmitting the first captured signal to a signal processing module in a speaker assembly, the signal processing method further comprises receiving a second ambient sound away from the human ear by a second sound receiving assembly, converting the second ambient sound to a second captured signal by the second sound receiving assembly, and outputting the second captured signal to the signal processing module in the speaker assembly.

In one embodiment, in the step of performing transfer function calibration signal processing and inversion signal processing on the first captured signal by the signal processing module, the transfer function calibration signal processing comprises time domain signal processing; transforming the transfer function in the frequency domain into the transfer function in the time domain by Inverse Fourier transform; convolving the first captured signal in the time domain with the transfer function in the time domain to obtain the first captured signal after calibrated in the time domain; and inverting the first captured signal after calibrated in the time domain.

In one embodiment, in the step of performing transfer function calibration signal processing and inversion signal processing on the first captured signal by the signal processing module, the transfer function calibration signal processing comprises frequency domain signal processing; transforming the first captured signal in the time domain into the first captured signal in the frequency domain by Fourier transforming; multiplying the first captured signal in the frequency domain with the transfer function in the frequency domain to obtain the first captured signal after calibrated in the frequency domain; transforming the first captured signal after calibrated in the frequency domain by inverse Fourier transform into the first captured signal after calibrated in the time domain; and inverting the first captured signal after calibrated in the time domain.

In one embodiment, the formula for the inverse Fourier transform is $$f(t) = \frac{1}{2\pi}\int_{-\infty}^{+\infty} F(\omega)e^{i\omega t}d\omega.$$

In one embodiment, the formula for the Fourier transform is $$F(\omega) = \int_{-\infty}^{+\infty} f(t)e^{-i\omega t}dt.$$

In one embodiment, after the step of sequentially performing transfer function calibration signal processing and inversion signal processing on the first captured signal by the signal processing module, signal processing method further comprises adjusting a gain coefficient to adjust the noise reduction; the gain coefficient is a multiple for linear amplification or linear reduction for performing linear amplification or linear reduction for the first captured signal after inverted.

In another aspect of the disclosure, a signal processing method, adapted to a headset device with speakers, comprising: transmitting an audio sound to a human ear by the output module of a speaker assembly; receiving the audio sound and the first ambient sound adjacent to the human ear by a first sound receiving assembly, and converting the audio sound and the first ambient sound into a first captured signal by the first sound receiving assembly; eliminating the audio signal in the first capture signal; transmitting the first captured signal with the audio signal eliminated to a signal processing module in the speaker assembly; sequentially performing elimination signal processing, transfer function calibration signal processing, and inversion signal processing on the first captured signal with the audio signal eliminated by the signal processing module; and providing the captured signal after processed to an output module of the speaker assembly for outputting toward the human ear.

In one embodiment, before the step of transmitting the first captured signal to a signal processing module in a speaker assembly, the signal processing method further comprises receiving a second ambient sound away from the human ear by a second sound receiving assembly, converting the second ambient sound to a second captured signal by the second sound receiving assembly, and outputting the second captured signal to the signal processing module in the speaker assembly.

In one embodiment, in the step of sequentially performing elimination signal processing, transfer function calibration signal processing, and inversion signal processing on the first capture signal, the transfer function calibration signal processing comprises time domain signal processing; transforming the transfer function in the frequency domain into the transfer function in the time domain by Inverse Fourier transform; convolving the first captured signal in the time domain with the transfer function in the time domain to obtain the first captured signal after calibrated in the time domain; and inverting the first captured signal after calibrated in the time domain.

In one embodiment, in the step of sequentially performing elimination signal processing, transfer function calibration signal processing, and inversion signal processing on the first capture signal, the transfer function calibration signal processing comprises frequency domain signal processing; transforming the first captured signal in the time domain into the first captured signal in the frequency domain by Fourier transform; multiplying the first captured signal in the frequency domain with the transfer function in the frequency domain to obtain the first captured signal after calibrated in the frequency domain; transforming the first captured signal after calibrated in the frequency domain by inverse Fourier transform into the first captured signal after calibrated in the time domain; and inverting the first captured signal after calibrated in the time domain.

In one embodiment, the formula for the inverse Fourier transform is $$f(t) = \frac{1}{2\pi}\int_{-\infty}^{+\infty} F(\omega)e^{i\omega t}d\omega.$$

In one embodiment, the formula for the Fourier transform is $$F(\omega) = \int_{-\infty}^{+\infty} f(t)e^{-i\omega t}dt.$$

In one embodiment, in the step of sequentially performing elimination signal processing, transfer function calibration signal processing, and inversion signal processing on the first captured signal by the signal processing module, the signal processing method further comprises adjusting a gain coefficient to adjust the noise reduction; the gain coefficient is a multiple for linear amplification or linear reduction for performing linear amplification or linear reduction for the first captured signal after inverted.

In another aspect of the disclosure, an analysis system, adapted to a headset device with speakers, comprising: a measurement module, a sound output module, a sound receiving module, and a detection assembly. The measurement module has an artificial head and a sound receiving assembly; the sound receiving assembly is configured on the artificial head; the headset device with speakers is configured on the artificial head; the speaker assembly corresponds to the sound receiving assembly. The sound output module is electrically connected to the speaker assembly. The sound receiving module is electrically connected to the sound receiving assembly. The detection assembly is electrically connected to the sound output module and the sound receiving module. The detection assembly outputs a first sound signal; the first sound signal is transmitted to the speaker assembly by the sound output module; the speaker assembly outputs the first sound; the first sound is transmitted through the air and becomes a second sound; the sound receiving assembly receives the second sound and converts the second sound into a second sound signal; the second sound signal is transmitted to the detection assembly by the sound receiving module; the detection assembly calculates transfer function relationship between the first sound signal and the second sound signal.

In one embodiment, the speaker component outputs the first sound at 20 Hz to 20 kHz.

In one embodiment, the sound output module further comprises a sound output unit and a power amplifying unit; the sound output unit is connected to the power amplifying unit; the first sound signal is transmitted to the speaker assembly by the sound output unit and the power amplifying unit in sequence.

In one embodiment, the detection assembly comprises testing software, audio editing software, or audio analysis programs.

The embodiments of the present disclosure provide a headset device with speakers, a signal processing method and an analysis system thereof. The headset device with speakers includes a speaker assembly and a first sound receiving assembly, and provides noise reduction effect on surrounding environment by the signal processing method for the headset with speakers. The speaker assembly includes a signal processing module. The signal processing module performs calibration by the sound transfer function to solve the playback influence arisen from the sound transmission distance between the speaker assembly and the human ear. The signal processing module performs calibration to calibrate the signal outputted by the speaker assembly to cancel the environmental noise, so that it can effectively solve the problem of attenuation of the sound received by the human ear due to the sound transmission distance of the open speaker. In addition, an analysis system for the headset device with speakers is provided for measuring the actual sound change for the sound output from the speaker assembly to the sound received by the first sound receiving assembly, so as to calculate the value of the transfer function from the speaker to the human ear.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/ substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
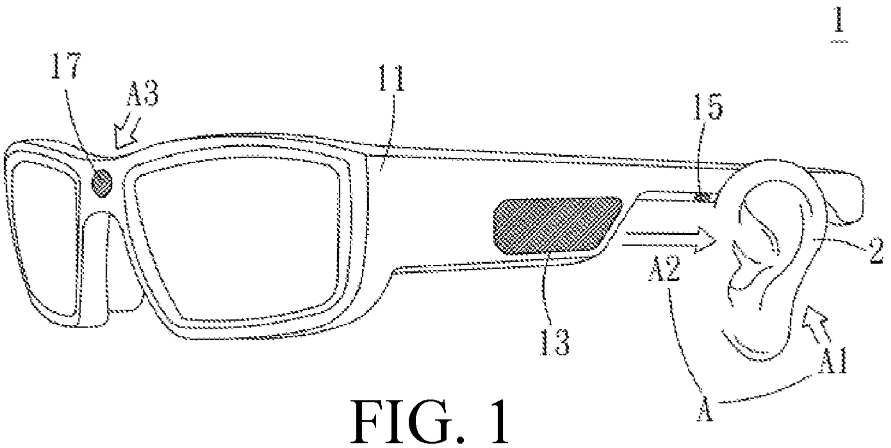
FIG. 1 is a perspective view of a headset device with speakers of the present disclosure.
Figure 2:
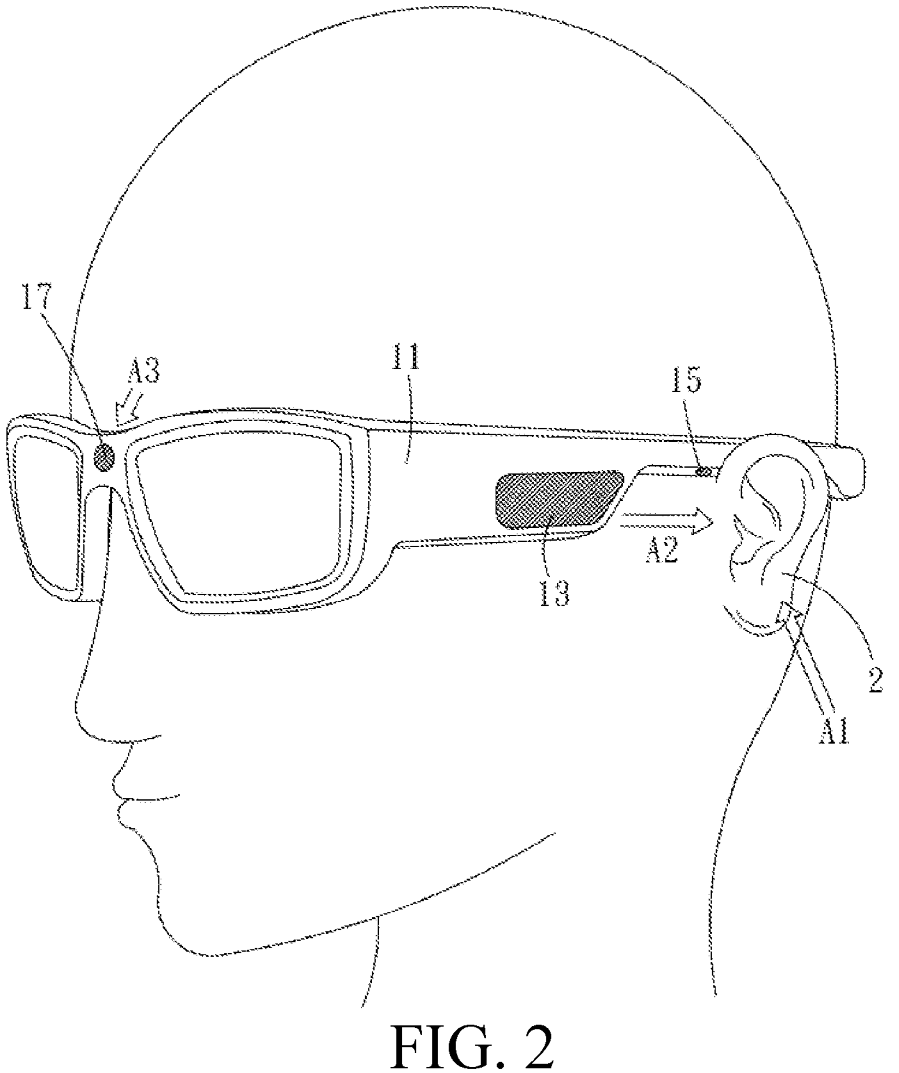
FIG. 2 is a diagram of the use state of the headset device with speakers of the present disclosure.

Refer to FIG. 1 and FIG. 2. FIG. 1 is a perspective view of the headset device with speakers of the present disclosure and FIG. 2. shows a use state diagram. As shown in the figure, this embodiment provides a headset device 1 with speakers includes a headset assembly 11, a speaker assembly 13 and a first sound receiving assembly 15. The first sound receiving assembly 15 is configured on the headset assembly 11, and the first sound receiving assembly 15 is configured adjacent to the human ear 2. That is the sound receiving port of the first sound receiving assembly 15 is configured toward the direction of the human ear 2. The speaker assembly 13 is configured on the headset assembly 11. The speaker assembly 13 is configured on one side of the first sound receiving assembly 15. The sound output port of the speaker assembly 13 is configured toward the human ear 2. The first sound receiving assembly 15 is used to receive the ambient sound A near the human ear 2, and provide the ambient sound A to the speaker assembly 13 for signal processing. The signal-processed ambient sound A is output to the human ear 2 by the speaker assembly 13. The ambient sound A includes the first ambient sound A1 or a combination of the first ambient sound A1 and the audio sound A2.

Figure 3:
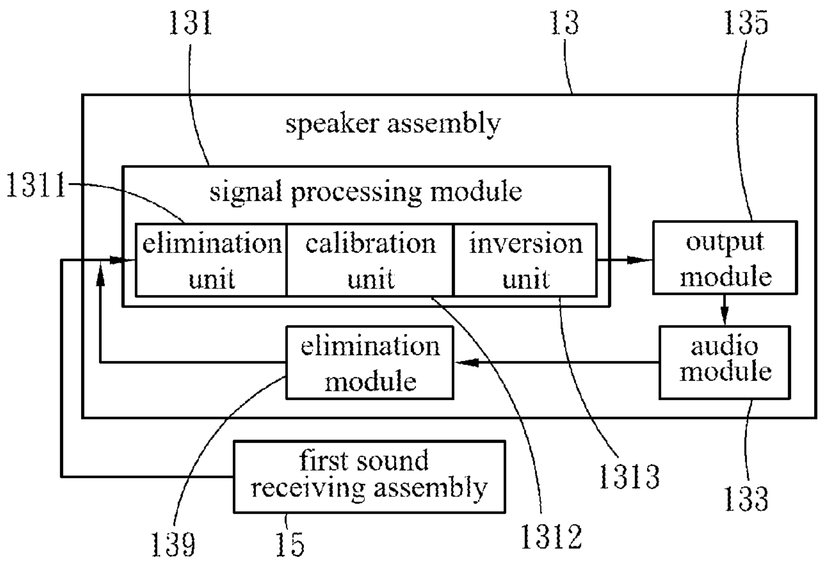
FIG. 3 is a structural connection diagram of a headset device with speakers according to the first embodiment of the present disclosure.
Figure 4:
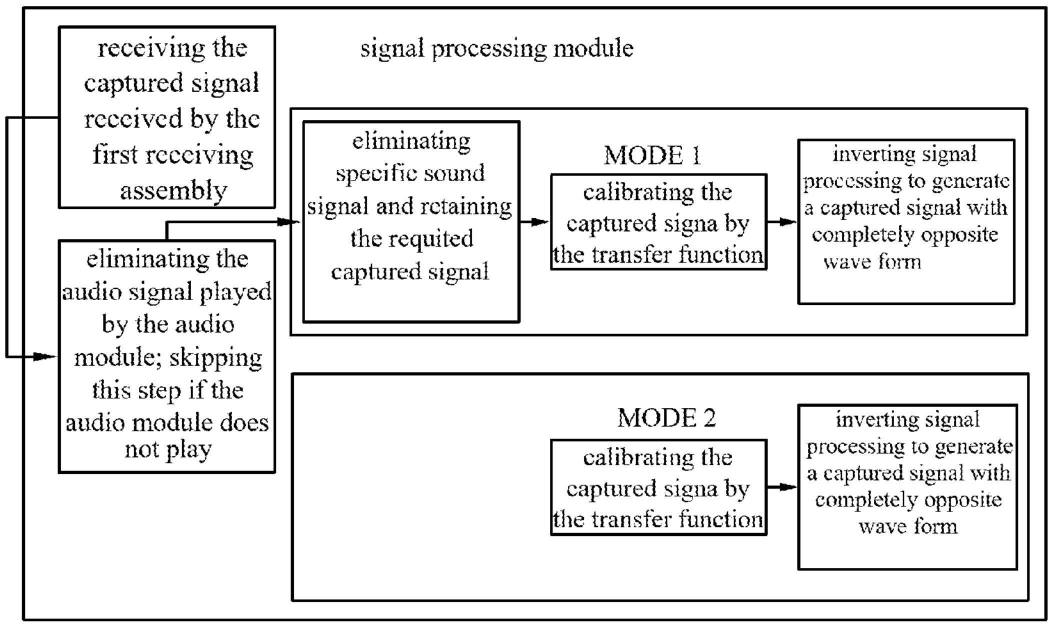
FIG. 4 is a schematic diagram of the steps of the signal processing module in the first embodiment of the present disclosure.

Refer to FIG. 3 and FIG. 4. FIG. 3 is a structural connection diagram of a headset device with speakers according to the first embodiment of the present disclosure. FIG. 4 is a schematic diagram of the steps of the signal processing module in the first embodiment of the present disclosure. As shown in the figure, in this embodiment, the speaker assembly 13 further includes a signal processing module 131 and an output module 135. The first sound receiving assembly 15 is connected to the signal processing module 131. The signal processing module 131 is connected to the output module 135. The first sound receiving assembly 15 receives the ambient sound A and converts the ambient sound A into a capture signal. The signal processing module 131 processes the capture signal, and the processed captured signal is played and output by the output module 135.

In this embodiment, the signal processing module 131 includes an elimination unit 1311, a calibration unit 1312 and an inversion unit 1313. The signal processing module 131 modifies the captured signal of the ambient sound A received by the first sound receiving assembly 15 through the above units. Furthermore, the captured signal can be processed by the elimination unit 1311 to eliminate the signal. The elimination unit 1311 can process specific sounds in the ambient sound A, such as car sounds, human voices, rain sounds, or call sounds, etc. to eliminate different specific sound signals. The specific sound signal to be eliminated is the captured signal that the user needs to keep. In this embodiment, the elimination unit 1311 can be selected or not used according to the needs of the user.

As mentioned above, the captured signal after the signal is eliminated is processed by the calibration unit 1312 for signal calibration. The calibration unit 1312 calibrates the captured signal of the sound through a transfer function with respect to the transmission distance of the output sound from the speaker assembly 13 to the human ear 2. In other words, the sound from the speaker assembly 13 would not be concentrated and weakened after a certain distance. Therefore, it is necessary to calculate the change from the sound output by the speaker assembly 13 to the sound received by the human ear 2 through the calibration unit 1312, i.e., the sound received by the first sound receiving assembly 15, and propose adjustments and compensations for the above-mentioned sound changes to ensure the contemplated sound effect received by the human ear 2 is close to the sound effect actually received by the human ear 2 after the sound from the speaker assembly 13 changes with the distance.

The captured signal after signal calibrated is subjected to signal inverting processing by the inverting unit 1313. The inverting unit 1313 performs inverting processing on the acoustic fluctuation of the captured signal, thereby providing a completely opposite waveform to the captured signal. In other words, when the sound wave of the captured signal before inversion is combined with the sound wave of the captured signal after inversion, they can cancel for each other to achieve the effect of noise reduction. Finally, the captured signal after signal inverting is output to the human ear 2 by the output module 135.

Furthermore, the speaker assembly 13 further includes an audio module 133 and an elimination module 139. One end of the audio module 133 is connected to the output module 135. One end of the elimination module 139 is connected to the audio module 133. The other end of the elimination module 139 is connected to the first sound receiving assembly 15 and the signal processing module 131. The audio module 133 transmits the audio signal to the output module 135, and the audio signal outputs the audio sound toward the direction of the human ear 2 through the output module 135. The first sound receiving assembly 15 receives the ambient sound to form a captured signal. The ambient sound is a mixture of the audio sound and the surrounding sound. At the same time, the audio module 133 also performs the audio signal cancellation to the audio signal by the elimination module 139. When the first sound receiving assembly 15 transmits the captured signal to the signal processing module 131, the elimination module 139 first eliminates the audio signal in the captured signal, and then transmits the captured signal with the eliminated audio signal to the signal processing module 131. In addition, the captured signal with the eliminated audio signal can also be sequentially processed by the signal processing module 131 for signal eliminating, signal calibrating, and signal inverting. Afterwards, the captured signal after inverted is output together with the audio signal sent by the audio module 133 to the human ear 2 by the output module 135.

Figure 5:
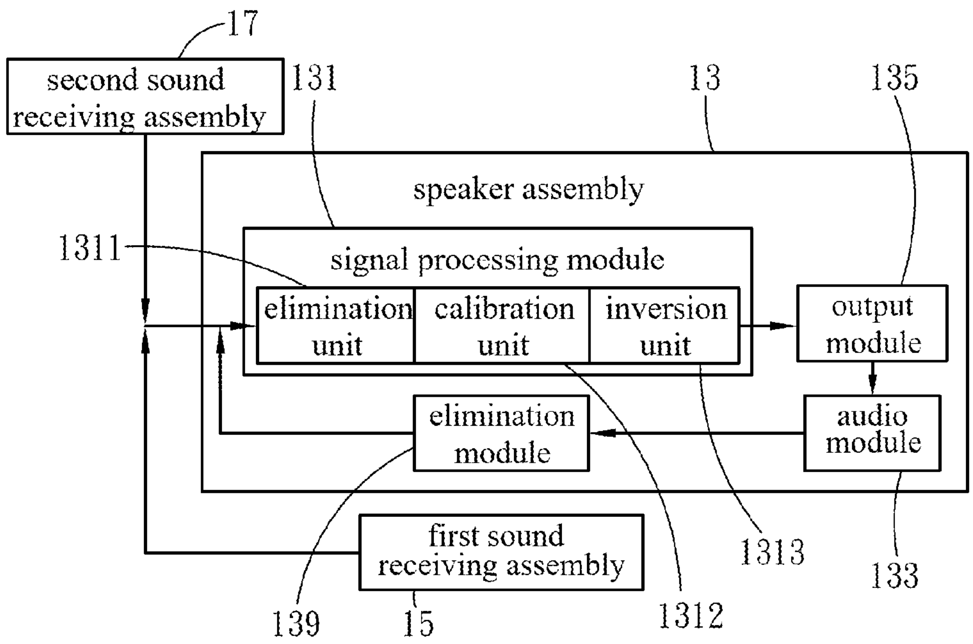
FIG. 5 is a structural connection diagram of a headset device with speakers according to a second embodiment of the present disclosure.
Figure 6:
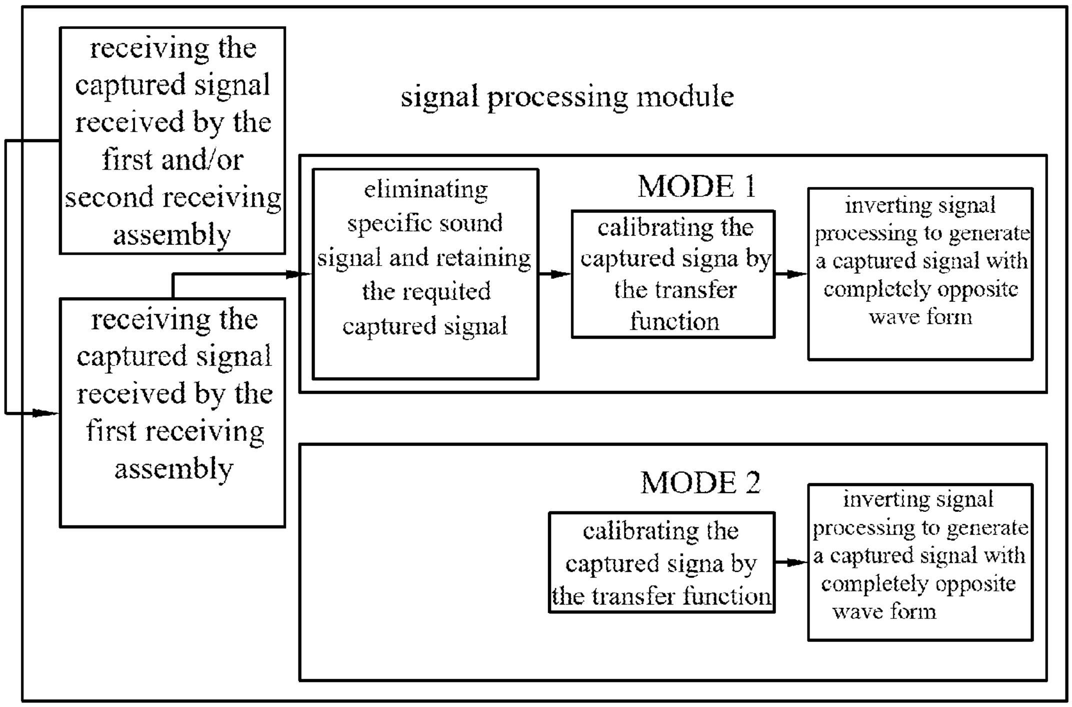
FIG. 6 is a schematic diagram of steps of a signal processing module according to a second embodiment of the present disclosure.

Refer to FIG. 5 and FIG. 6. FIG. 5 is a structural connection diagram of a headset device with speakers according to a second embodiment of the present disclosure. FIG. 6 is a schematic diagram of steps of a signal processing module according to a second embodiment of the present disclosure. As shown in the figure, compared with the first embodiment, this embodiment further includes a second sound receiving assembly 17. In this embodiment, the second sound receiving assembly 17 is configured on the headset assembly 11. The second sound receiving assembly 17 is configured on the side of the first sound receiving assembly 15 away from the human ear 2. The second sound receiving assembly 17 is used to receive the second ambient sound A3 away from the human ear 2. The second ambient sound A3 is the ambient sound that are further away from the human ear 2. The signal processing module 131 processes and receives the captured signals received by the first sound receiving assembly 15 and/or the second sound receiving assembly 17, and perform the same steps as the first embodiment. Therefore, the details are not repeated again. In this way, when the speaker assembly 13 is to broadcast the surrounding environment in a wide range, it can also produce a certain degree of noise reduction effect on the broadcast sound in the surrounding space.

Figure 7:
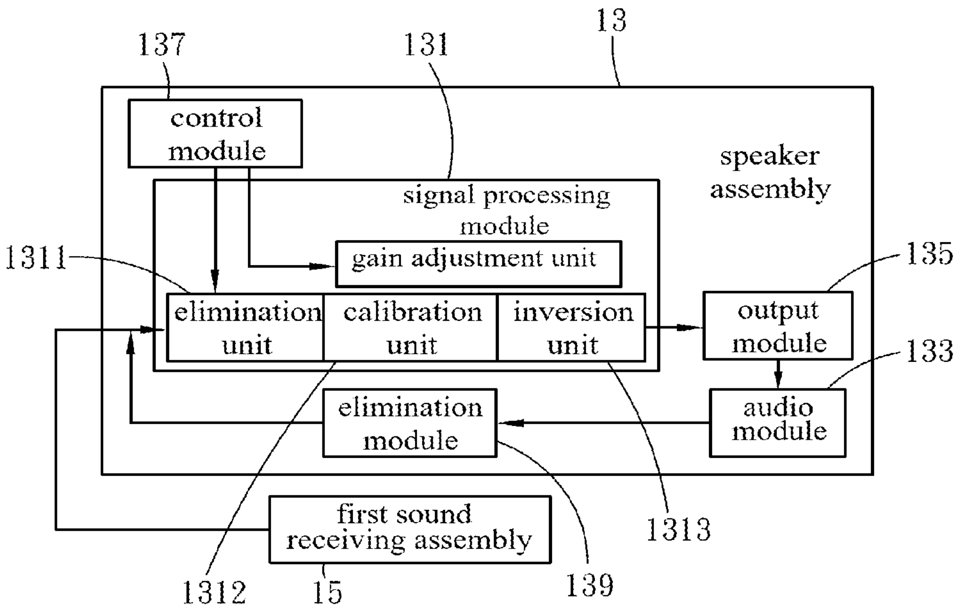
FIG. 7 is a structural connection diagram of a headset device with speakers according to a third embodiment of the present disclosure.
Figure 8:
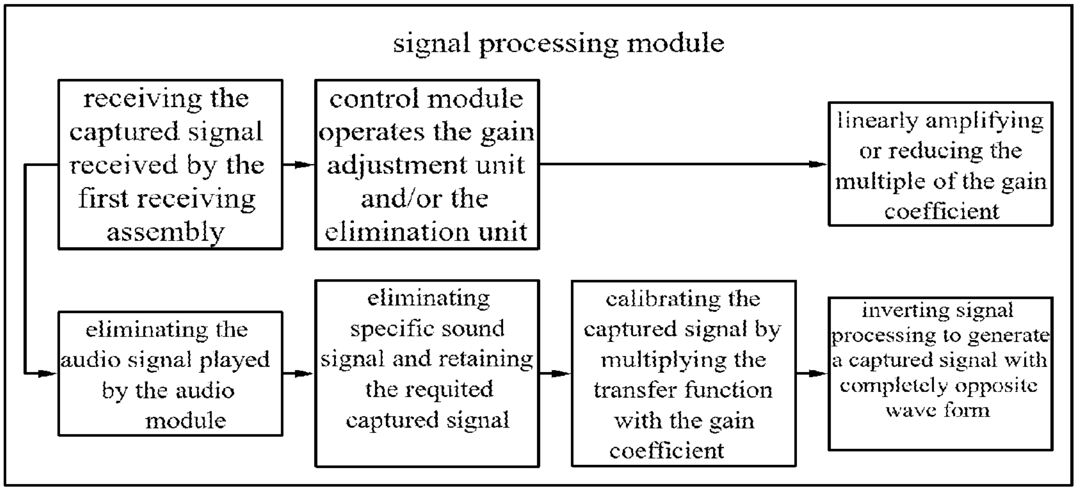
FIG. 8 is a schematic diagram of steps of a signal processing module according to a third embodiment of the present disclosure.

Refer to FIG. 7 and FIG. 8. FIG. 7 is a structural connection diagram of a headset device with speakers according to a third embodiment of the present disclosure. FIG. 8 is a schematic diagram of steps of a signal processing module according to a third embodiment of the present disclosure. As shown in the figure, compared with the first embodiment, this embodiment further includes a control module 137 and a gain adjustment unit 1314 in the signal processing module 131. The control module 137 controls the elimination unit 1311, the calibration unit 1312 and/or the gain adjustment unit 1314 in the signal processing module 131. The control module 137 can select the sound to be eliminated by the elimination unit 1311, or select to eliminate all sounds or select not to eliminate all sounds, etc. The control module 137 controls the gain adjustment unit 1314 to adjust the gain coefficient of the captured signal after the inverted. It adjusts the noise reduction through adjusting the gain coefficient as a multiple of the linear amplification or the linear reduction multiple.

Figure 9:
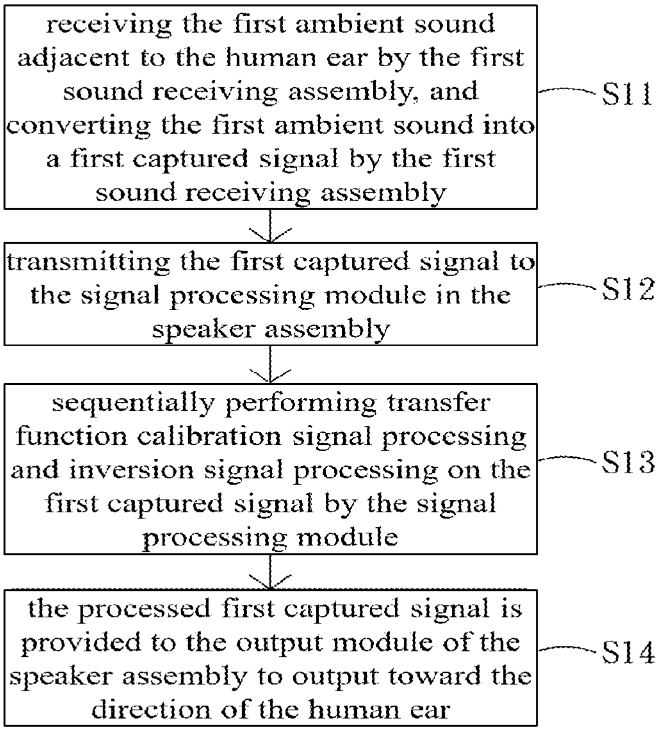
FIG. 9 is the steps of a signal processing method of a headset device with speakers according to the first embodiment of the present disclosure.

Refer to FIG. 9, which is the steps of a signal processing method of a headset device with speakers according to the first embodiment of the present disclosure. As shown in the figure, this embodiment provides a signal processing method for the headset device 1 with speakers, the steps of which include:

- Step S11: receiving the first ambient sound A1 adjacent to the human ear 2 by the first sound receiving assembly 15, and converting the first ambient sound A1 into a first captured signal by the first sound receiving assembly 1;
- Step S12: transmitting the first captured signal to the signal processing module 131 in the speaker assembly 13;
- Step S13: sequentially performing transfer function calibration signal processing and inversion signal processing on the first captured signal by the signal processing module 131, wherein the transfer function calibration signal processing of the signal processing module 131 includes time domain signal processing and frequency domain signal processing;

When the transfer function calibration signal is processed through time-domain signal processing, the transfer function in the frequency domain is inversely Fourier transformed into a transfer function in the time domain. The first captured signal in the time domain is convolved with the transfer function in the time domain to obtain the first captured signal in the time domain after calibration signal processing.

When the transfer function calibration signal is processed through time-domain signal processing, the first captured signal in the time domain is Fourier transformed into the first captured signal in the frequency domain. The first captured signal in the frequency domain is multiplied by the transfer function in the frequency domain to obtain the first captured signal after calibration signal in the frequency domain. Then, the first captured signal processed by the calibration signal in the frequency domain is inversely Fourier transformed into the first signal processed by the calibration signal in the time domain.

The formula for the inverse Fourier transform is $$f(t) = \frac{1}{2\pi}\int_{-\infty}^{+\infty} F(\omega)e^{i\omega t}d\omega.$$

The formula for the Fourier transform is $$F(\omega) = \int_{-\infty}^{+\infty} f(t)e^{-i\omega t}dt_{\circ}$$

After the above-mentioned time domain signal processing or frequency domain signal processing, the first captured signal on the time domain after the calibration signal processing is performed with inversion signal processing. In addition, the transfer function in this embodiment is the value calculated by the detection and analysis of the analysis system. The transfer function is a correction value for the sound from the speaker assembly 13 to the human ear 2 (that is, the first sound receiving assembly 15) with decreasing changes. See descriptions of subsequent examples.

Step 14: the processed first captured signal is provided to the output module 135 of the speaker assembly 13 to output toward the direction of the human ear 2.

Refer to FIG. 2. In this embodiment, the user wears the headset device 1 with speakers. When operating the headset device 1 with speakers to perform noise reduction processing, the first sound receiving assembly 15 receives ambient sound near the human ear 2, i.e., the human ear 2 can receive ambient noise. The ambient sound of the first sound receiving assembly 15 is converted into a first captured signal to the signal processing module 131 of the speaker assembly 13. The signal processing module 131 processes the first captured signal, and performs transfer function calibration signal processing on the first captured signal, so that the sound of the first captured signal output by the output module 135 of the speaker assembly 13 is similar to the sound that reaches the human ear 2. The first captured signal after the transfer function calibration signal processing is performed with inversion signal processing. The sound first captured signal after inverting output by the output module 135 of the speaker assembly 13 is completely opposite to the sound reaches the human ear 2. In this way, the current ambient sounds cancel each other out, and form a noise reduction effect on the ambient sounds that can be received by the human ear 2.

Moreover, before the step of transmitting the first captured signal to the signal processing module 131 in the speaker assembly 13, the method further comprises receiving a second ambient sound A3 away from the human ear 2 by a second sound receiving assembly 17, converting the second ambient sound A3 to a second capture signal by the second sound receiving assembly 17, and outputting the second capture signal to the signal processing module 131 in the speaker assembly 13. In this way, the signal processing module 131 also processes in the same way. When the speaker assembly 13 broadcasts the surrounding environment in a wide range, the sound played by the speaker assembly 13 can also produce a certain degree of noise reduction effect in the surrounding space.

Furthermore, in the step of sequentially performing transfer function calibration signal processing and inversion signal processing on the first capture signal by the signal processing module 131, the method further comprises adjusting a gain coefficient of the gain adjustment unit 1314 by the control module 137 to adjust the noise reduction. The gain coefficient is a multiple for linear amplification or linear reduction for performing linear amplification or linear reduction for the first capture signal after inverted. When the effect of amplification and noise reduction is adjusted in this way, the ambient sound received by the human ear 2 is reduced. When the adjustment reduces the noise reduction effect, the ambient sound received by the human ear 2 is amplified. The above can be adjusted according to the needs of users.

Figure 10:
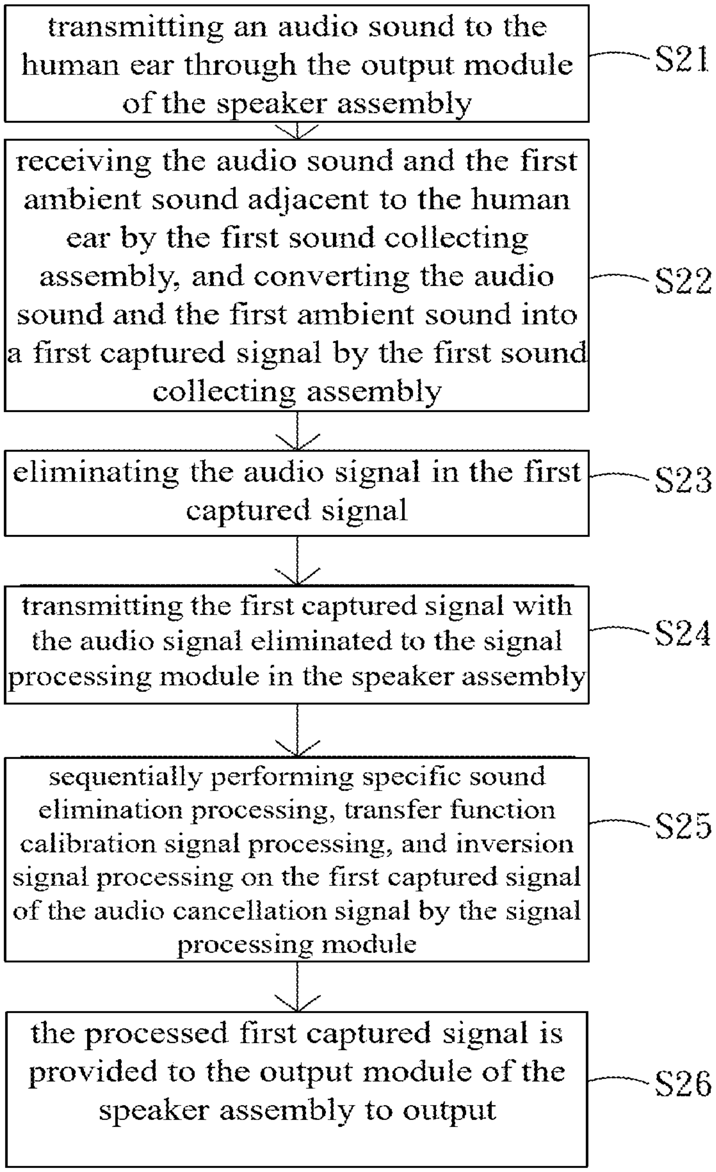
FIG. 10 is the steps of a signal processing method of a headset device with speakers according to a second embodiment of the present disclosure.

Refer to FIG. 10 showing the steps of a signal processing method of a headset device with speakers according to a second embodiment of the present disclosure. As shown in the figure, this embodiment provides a signal processing method for the headset device 1 with speakers, the steps of which include:

- Step S21: transmitting an audio sound to the human ear through the output module of the speaker assembly 13, wherein the audio sound is the sound that the audio module 133 sends an audio signal to the output module 135;
- Step S22: receiving the audio sound A2 and the first ambient sound A1 adjacent to the human ear 2 by the first sound collecting assembly 15, and converting the audio sound A2 and the first ambient sound A1 into a first captured signal by the first sound collecting assembly 15;
- Step S23: eliminating the audio signal in the first captured signal; wherein the audio module 133 simultaneously sends an audio signal to the elimination module 139, so that the elimination module 139 performs elimination processing on the first captured signal;
- Step S24: transmitting the first captured signal with the audio signal eliminated to the signal processing module 131 in the speaker assembly 13;
- Step S25: sequentially performing specific sound elimination processing, transfer function calibration signal processing, and inversion signal processing on the first captured signal of the audio cancellation signal by the signal processing module 131. First, the sound signal to be retained is eliminated by the elimination unit 1311 of the signal processing module 131, that is, to eliminate the sound signal of a specific sound, such as car sound, human voice, rain sound or call sound, etc. The specific sound signal to be eliminated is the captured signal of the first ambient sound A1 that the user needs to keep. Furthermore, the transfer function calibration signal processing of the calibration unit 1312 of the signal processing module 131 includes time domain signal processing and frequency domain signal processing. The foregoing manner is the same as that of the first embodiment, so details are not repeated here. Finally, the inversion unit 1313 of the signal processing module 131 performs inversion signal processing.
- Step 26: the processed first captured signal is provided to the output module 135 of the speaker assembly 13 to output.

In addition, the signal processing method of the headset device with speakers in this embodiment also includes the processing method of the second sound receiving assembly 17 and the control module 137 of the speaker assembly 13 in the first embodiment, so it will not be repeated herein.

Figure 11:
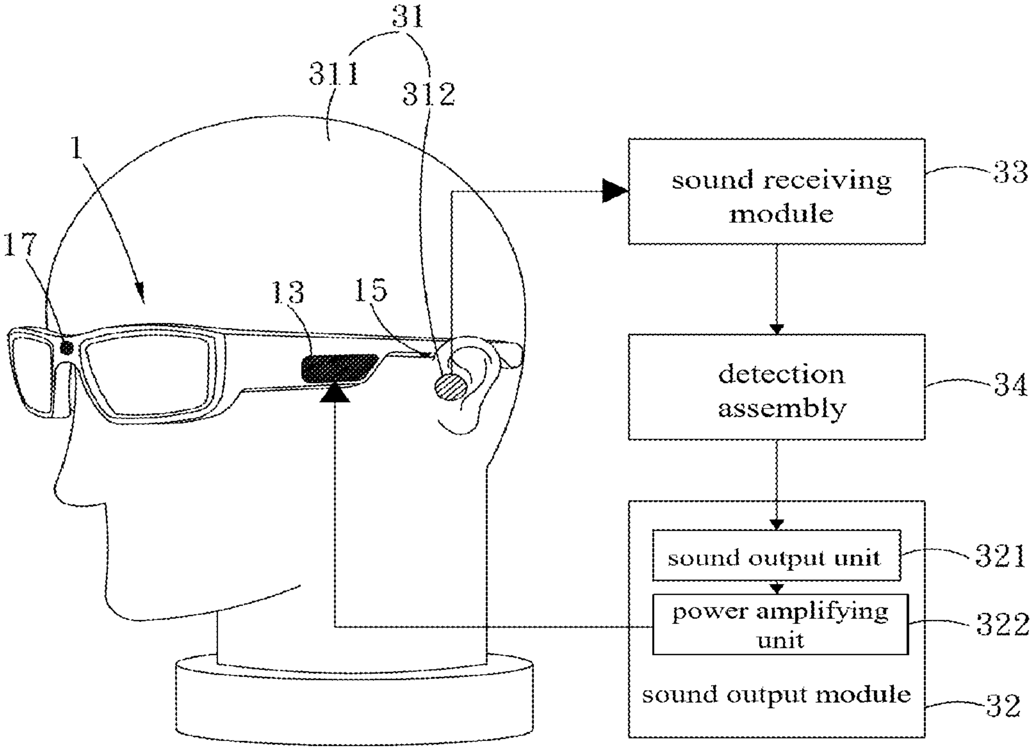
FIG. 11 is a schematic diagram of an analysis system of a headset device with speakers of the present disclosure.

Refer to FIG. 11 showing a schematic diagram of an analysis system of a headset device with speakers of the present disclosure. As shown in the figure, this embodiment provides an analysis system for a headset device with speakers, including: a measurement assembly 31, a sound output module 32, a sound receiving module 33 and a detection assembly 34. The measurement assembly 31 has an artificial head 311 and a sound receiver 312. The sound receiver 312 is configured on the artificial head 311 (that is, the corresponding position of the human ear). The headset device 1 with speakers is configured on the artificial head 311, and the speaker assembly 13 corresponds to the sound receiver 312. The sound output module 32 is electrically connected to the speaker assembly 13. The sound receiving module 33 is electrically connected to the sound receiving assembly 312. The detection assembly 34 is electrically connected to the sound output module 32 and the sound receiving module 33 respectively. The detection component 34 outputs a first sound signal. The first sound signal is transmitted to the speaker assembly 13 through the sound output module 32. The speaker assembly 13 outputs the first sound. The first sound is transmitted toward the sound receiving assembly 312, and the first sound is transmitted through the air become the second sound. The sound receiver 312 receives the second sound and converts it into a second sound signal. The second sound signal is transmitted to the detection assembly 34 by the sound receiving module 33. The detection assembly 34 calculates the transfer function relationship between the first sound signal and the second sound signal. That is, the second sound signal can be obtained after the first sound signal is simply calculated by the transfer function. The sound output module 32 further includes a sound output unit 321 and a power amplification unit 322. The sound output unit 321 is connected to the power amplifying unit 322, and the first sound signal is transmitted to the speaker assembly 13 through the sound output unit 321 and the power amplifying unit 322 in sequence.

The value of the transfer function by the above method is calculated. The value is applied to the value of the transfer function in two ways of time domain signal processing and frequency domain signal processing for the the transfer function calibration signal processing of the signal processing module 131. The value of the transfer function of this embodiment can be adjusted due to the change of the position or direction of the speaker assembly 13, the first sound collection assembly 15 or the second sound collection assembly 17. The value of the transfer function can be calculated and adjusted according to the needs of users. In the detection and analysis method of the above analysis system, the speaker assembly 13 is used to output a detection sound of 20 Hz to 20 kHz. The detection assembly 34 includes testing software, audio editing software or audio analysis program for signal transmission and analysis equipment or software. The testing software may be soundcheck or AP×555 for example; the audio editing software may be audition or Cool edit for example; the audio analysis programs may be Matlab or C++, etc.

In summary, the embodiments of the present disclosure provide a headset device with speakers, a signal processing method and an analysis system thereof. The headset device with speakers includes a speaker assembly and a first sound receiving assembly, and provides noise reduction effect on surrounding environment by the signal processing method for the headset with speakers. The speaker assembly includes a signal processing module. The signal processing module performs calibration by the sound transfer function to solve the playback influence arisen from the sound transmission distance between the speaker assembly and the human ear. The signal processing module performs calibration to calibrate the signal outputted by the speaker assembly to cancel the environmental noise, so that it can effectively solve the problem of attenuation of the sound received by the human ear due to the sound transmission distance of the open speaker. In addition, an analysis system for the headset device with speakers is provided for measuring the actual sound change for the sound output from the speaker assembly to the sound received by the first sound receiving assembly, so as to calculate the value of the transfer function from the speaker to the human ear.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A headset device with speakers, comprising:

a headset assembly;

a first sound receiving assembly configured on the headset assembly, the first sound-receiving assembly being at a position adjacent to a human ear; and a speaker assembly configured on the headset assembly, and the speaker assembly being on one side of the first sound-receiving assembly;

wherein, the first sound receiving assembly receives an ambient sound near the human ear, and provides a captured signal converted from the ambient sound to the speaker assembly for signal processing;

wherein the speaker assembly comprises a signal processing module, the signal processing module comprises a calibration unit configured to perform calibration on the captured signal through a transfer function with respect to a transmission distance of an output sound from the speaker assembly to the human ear; and wherein the speaker assembly outputs a processed captured signal to the human ear.

2. The headset device according to claim 1, wherein the speaker assembly further comprises an output module, the first sound receiving assembly is connected to the signal processing module, and the signal processing module is connected to the output module, wherein the output module outputs and plays the processed captured signal.

3. The headset device according to claim 2, wherein the signal processing module comprises an elimination unit and an inversion unit; the elimination unit performs signal elimination processing to the captured signal; the calibration unit performs calibration to the captured signal after signal elimination processed; the inversion unit performs inversion to the captured signal after calibrated; the output module outputs the captured signal after inverted to the human ear.

4. The headset device according to claim 3, wherein the signal processing module further includes a gain adjustment unit; the gain adjustment unit is used to adjust the gain coefficient of the captured signal after inverted to adjust a noise reduction.

5. The headset device according to claim 2, further comprises an audio module and an elimination module; one end of the audio module is connected to the output module; one end of the elimination module is connected to the audio module; the other end of the elimination module is connected between the first sound receiving assembly and the signal processing module; the audio module transmits an audio signal to the output module; the output module outputs the audio sound toward the human ear; the first sound receiving assembly receives the ambient sound into the captured signal; after the elimination module eliminates the audio signal in the captured signal, the captured signal with the audio signal eliminated is transmitted to the signal processing module.

6. The headset device according to claim 5, wherein the signal processing module comprises an elimination unit, a calibration unit, and an inversion unit; the elimination unit performs signal elimination processing to the captured signal with the audio signal eliminated; the calibration unit performs calibration to the captured signal after signal elimination processed; the inversion unit performs inversion to the captured signal after calibrated; the output module outputs the captured signal after inverted and the audio signal outputted by the audio module to the human ear.

7. The headset device according to claim 6, wherein the signal processing module further includes a gain adjustment unit; the gain adjustment unit is used to adjust the gain coefficient of the captured signal after inverted to adjust the noise reduction.

8. The headset device according to claim 7, wherein the speaker assembly further comprises a control module; the control module controls the elimination unit, the calibration unit and/or the gain adjustment unit in the signal processing module.

9. The headset device according to claim 1, wherein the ambient sound comprises a first ambient sound or a combination of the first ambient sound and an audio sound.

10. The headset device according to claim 1, wherein further comprises a second sound receiving assembly; the second sound receiving assembly is configure on the headset assembly; the second sound receiving assembly is configured on the side of the first sound receiving assembly away from the human ear; the second sound receiving assembly is used to collect a second ambient sound away from the human ear.

11. A signal processing method, adapted to a headset device with speakers, comprising:

receiving a first ambient sound adjacent to a human ear by a first sound receiving assembly, and converting the first ambient sound into a first captured signal by the first sound receiving assembly;

transmitting the first captured signal to a signal processing module in a speaker assembly;

sequentially performing transfer function calibration signal processing and inversion signal processing on the first captured signal by the signal processing module, wherein the transfer function calibration signal processing calibrates the first captured signal through a transfer function with respect to a transmission distance of an output sound from the speaker assembly to the human ear; and providing a processed first captured signal to an output module of the speaker assembly for outputting toward the human ear.

12. The signal processing method according to claim 11, wherein before the step of transmitting the first captured signal to a signal processing module in a speaker assembly, further comprises receiving a second ambient sound away from the human ear by a second sound receiving assembly, converting the second ambient sound to a second captured signal by the second sound receiving assembly, and outputting the second captured signal to the signal processing module in the speaker assembly.

13. The signal processing method according to claim 11, wherein in the step of performing transfer function calibration signal processing and inversion signal processing on the first captured signal by the signal processing module, the transfer function calibration signal processing comprises time domain signal processing;

transforming the transfer function in the frequency domain into the transfer function in the time domain by Inverse Fourier transform;

convolving the first captured signal in the time domain with the transfer function in the time domain to obtain the first captured signal after calibrated in the time domain; and inverting the first captured signal after calibrated in the time domain.

14. The signal processing method according to claim 13, wherein the formula for the inverse Fourier transform is $$f(t) = \frac{1}{2\pi}\int_{-\infty}^{+\infty} F(\omega)e^{i\omega t}d\omega.$$

15. The signal processing method according to claim 11, wherein in the step of performing transfer function calibration signal processing and inversion signal processing on the first captured signal by the signal processing module, the transfer function calibration signal processing comprises frequency domain signal processing;

transforming the first captured signal in the time domain into the first captured signal in the frequency domain by Fourier transforming;

multiplying the first captured signal in the frequency domain with the transfer function in the frequency domain to obtain the first captured signal after calibrated in the frequency domain;

transforming the first captured signal after calibrated in the frequency domain by inverse Fourier transform into the first captured signal after calibrated in the time domain; and inverting the first captured signal after calibrated in the time domain.

16. The signal processing method according to claim 15, wherein the formula for the inverse Fourier transform is $$f(t) = \frac{1}{2\pi}\int_{-\infty}^{+\infty} F(\omega)e^{i\omega t}d\omega.$$

17. The signal processing method according to claim 16, wherein the formula for the Fourier transform is $$F(\omega) = \int_{-\infty}^{+\infty} f(t)e^{-i\omega t}dt.$$

18. The signal processing method according to claim 11, wherein after the step of sequentially performing transfer function calibration signal processing and inversion signal processing on the first captured signal by the signal processing module, further comprises adjusting a gain coefficient to adjust the noise reduction; the gain coefficient is a multiple for linear amplification or linear reduction for performing linear amplification or linear reduction for the first captured signal after inverted.

19. A signal processing method, adapted to a headset device with speakers, comprising:

transmitting an audio sound to a human ear by the output module of a speaker assembly;

receiving the audio sound and a first ambient sound adjacent to the human ear by a first sound receiving assembly, and converting the audio sound and the first ambient sound into a first captured signal by the first sound receiving assembly;

eliminating an audio signal in the first captured signal;

transmitting the first captured signal with the audio signal eliminated to a signal processing module in the speaker assembly;

sequentially performing elimination signal processing, transfer function calibration signal processing, and inversion signal processing on the first captured signal with the audio signal eliminated by the signal processing module, wherein the transfer function calibration signal processing calibrates the first captured signal through a transfer function with respect to a transmission distance of an output sound from the speaker assembly to the human ear; and providing a processed captured signal to an output module of the speaker assembly for outputting toward the human ear.

20. The signal processing method according to claim 19, wherein before the step of transmitting the first captured signal to a signal processing module in a speaker assembly, further comprises receiving a second ambient sound away from the human ear by a second sound receiving assembly, converting the second ambient sound to a second captured signal by the second sound receiving assembly, and outputting the second captured signal to the signal processing module in the speaker assembly.

21. The signal processing method according to claim 19, wherein in the step of sequentially performing elimination signal processing, transfer function calibration signal processing, and inversion signal processing on the first captured signal, the transfer function calibration signal processing comprises time domain signal processing;

transforming the transfer function in the frequency domain into the transfer function in the time domain by Inverse Fourier transform;

convolving the first captured signal in the time domain with the transfer function in the time domain to obtain the first captured signal after calibrated in the time domain; and inverting the first captured signal after calibrated in the time domain.

22. The signal processing method according to claim 21, wherein the formula for the inverse Fourier transform is $$f(t)=\frac{1}{2\pi}\int_{-\infty}^{+\infty}F(\omega)e^{i\omega t}d\omega.$$

23. The signal processing method according to claim 19, wherein in the step of sequentially performing elimination signal processing, transfer function calibration signal processing, and inversion signal processing on the first captured signal, the transfer function calibration signal processing comprises frequency domain signal processing;

transforming the first captured signal in the time domain into the first captured signal in the frequency domain by Fourier transform;

multiplying the first captured signal in the frequency domain with the transfer function in the frequency domain to obtain the first captured signal after calibrated in the frequency domain;

transforming the first captured signal after calibrated in the frequency domain by inverse Fourier transform into the first captured signal after calibrated in the time domain; and inverting the first captured signal after calibrated in the time domain.

24. The signal processing method according to claim 23, wherein the formula for the inverse Fourier transform is $$f(t)=\frac{1}{2\pi}\int_{-\infty}^{+\infty}F(\omega)e^{i\omega t}d\omega.$$

25. The signal processing method according to claim 24, wherein the formula for the Fourier transform is $$F(\omega)=\int_{-\infty}^{+\infty}f(t)e^{-i\omega t}dt.$$

26. The signal processing method according to claim 19, wherein in the step of sequentially performing elimination signal processing, transfer function calibration signal processing, and inversion signal processing on the first captured signal by the signal processing module, further comprises adjusting a gain coefficient to adjust the noise reduction; the gain coefficient is a multiple for linear amplification or linear reduction for performing linear amplification or linear reduction for the first captured signal after inverted.

27. An analysis system, adapted to a headset device with speakers, comprising:

a measurement module having an artificial head and a sound receiving assembly, the sound receiving assembly configured on the artificial head, the headset device with speakers configured on the artificial head, a speaker assembly corresponding to the sound receiving assembly;

a sound output module, electrically connected to the speaker assembly;

a sound receiving module, electrically connected to the sound receiving assembly; and a detection assembly, electrically connected to the sound output module and the sound receiving module;

wherein, the detection assembly outputs a first sound signal; the first sound signal is transmitted to the speaker assembly by the sound output module; the speaker assembly outputs a first sound; the first sound is transmitted through the air to the sound receiving assembly and is received as a second sound; the sound receiving assembly converts the second sound into a second sound signal; the second sound signal is transmitted to the detection assembly by the sound receiving module; the detection assembly calculates a transfer function relationship between the first sound signal and the second sound signal, wherein the transfer function relationship is configured to be applied to a calibration unit of a signal processing module in the speaker assembly to compensate for a playback influence arisen from a transmission distance between the speaker assembly and a human ear.

28. The analysis system according to claim 27, wherein the speaker component outputs the first sound at 20 Hz to 20 kHz.

29. The analysis system according to claim 27, wherein the sound output module further comprises a sound output unit and a power amplifying unit; the sound output unit is connected to the power amplifying unit; the first sound signal is transmitted to the speaker assembly by the sound output unit and the power amplifying unit in sequence.

30. The analysis system according to claim 27, wherein the detection assembly comprises testing software, audio editing software, or audio analysis programs.

* * * * *